United States Patent
Lavasani

(10) Patent No.: US 8,836,423 B2
(45) Date of Patent: Sep. 16, 2014

(54) METHOD AND APPARATUS FOR AUTOMATICALLY ADJUSTING THE BANDWIDTH OF AN ELECTRONIC AMPLIFIER

(75) Inventor: Seyed Hossein Miri Lavasani, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 170 days.

(21) Appl. No.: 13/154,898

(22) Filed: Jun. 7, 2011

(65) Prior Publication Data

US 2012/0313708 A1      Dec. 13, 2012

(51) Int. Cl.
*H03G 5/16*          (2006.01)
*H03G 3/30*          (2006.01)

(52) U.S. Cl.
CPC ................................. *H03G 3/3042* (2013.01)
USPC ........................................ 330/133; 330/254

(58) Field of Classification Search
CPC .............................. H03F 3/191; H03G 3/3042
USPC .......................................... 330/133, 136, 279
See application file for complete search history.

(56) References Cited

U.S. PATENT DOCUMENTS

| | | | |
|---|---|---|---|
| 4,471,317 A * | 9/1984 | Nilsson et al. | 330/141 |
| 4,608,542 A | 8/1986 | Siegel | |
| 5,673,001 A * | 9/1997 | Kim et al. | 330/284 |
| 6,054,908 A * | 4/2000 | Jackson | 333/174 |
| 6,504,429 B2 | 1/2003 | Kobayashi | |
| 6,639,473 B1 | 10/2003 | Kobayashi | |
| 6,879,216 B2 * | 4/2005 | Chen et al. | 330/302 |
| 8,295,798 B2 * | 10/2012 | Wang et al. | 455/266 |
| 2004/0145799 A1 | 7/2004 | Sedic | |
| 2010/0283543 A1 | 11/2010 | Shivaram et al. | |

* cited by examiner

*Primary Examiner* — Robert Pascal
*Assistant Examiner* — Khiem Nguyen

(57) ABSTRACT

A method and apparatus are provided for using an automatic BW adjustment circuit to automatically adjust the bandwidth of an electronic amplifier based on the amplitude of a signal that is output from a variable gain amplifier or of one or more variable gain stages that follow the amplifier. By automatically adjusting the bandwidth of the electronic amplifier based on the amplitude of the signal, bandwidth enhancement can be provided while also preventing, or at least reducing, peaking of the frequency response of the electronic amplifier.

29 Claims, 4 Drawing Sheets

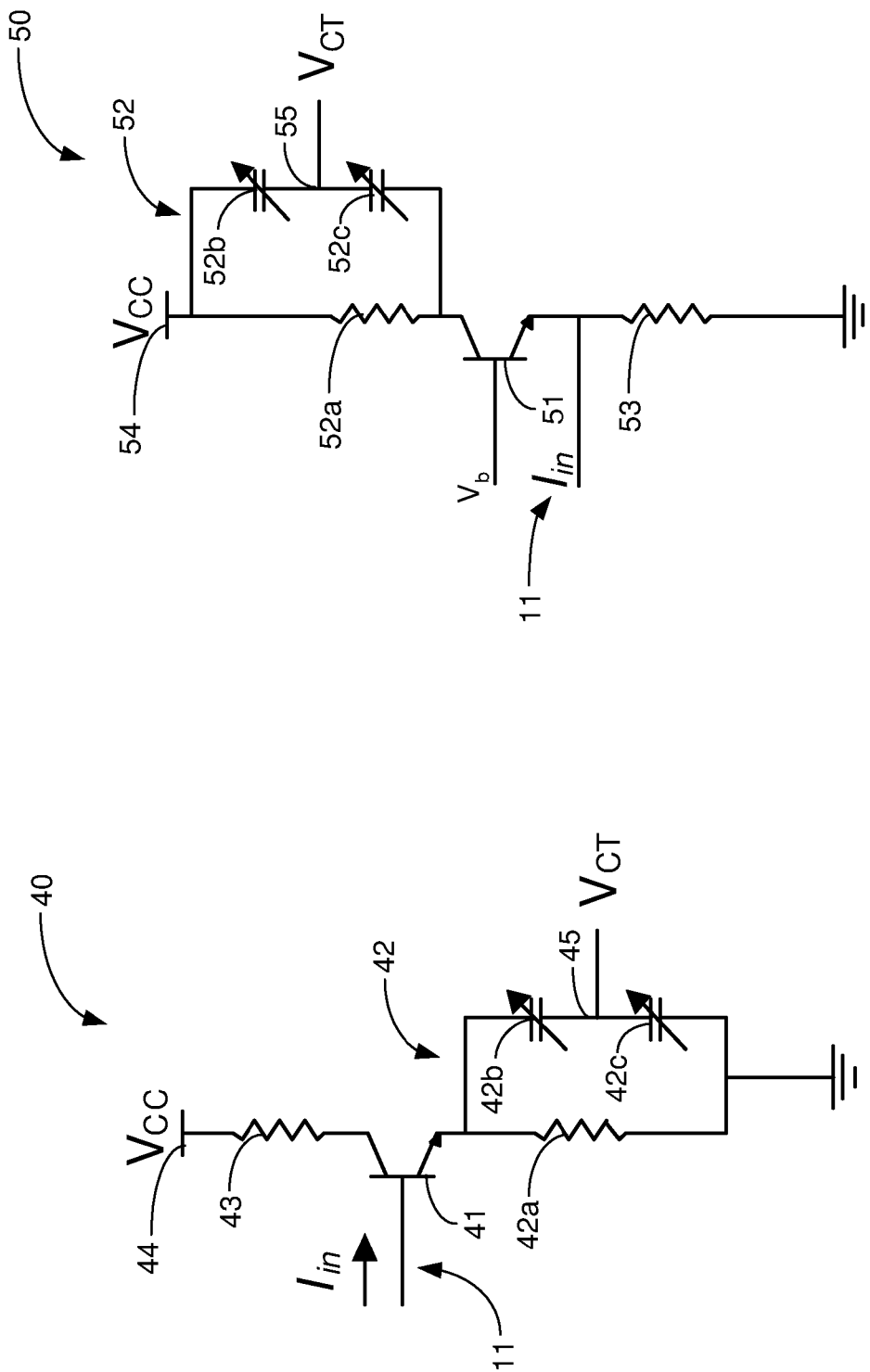

METHOD AND APPARATUS FOR AUTOMATICALLY ADJUSTING THE BANDWIDTH OF AN ELECTRONIC AMPLIFIER

TECHNICAL FIELD OF THE INVENTION

The invention relates to electronic amplifiers, and more particularly, to a method and apparatus for automatically adjusting the bandwidth of an electronic amplifier based on the gain of an output signal of the amplifier or of one or more gain stages that follow the amplifier.

BACKGROUND OF THE INVENTION

Electronic amplifiers come in a variety of configurations and types. For example, the term "electronic amplifier" applies to a current-to-voltage (I-V) amplifier, a voltage-to-voltage (V-V) amplifier, a voltage-to-current (V-I) amplifier, and a current-to-current (I-I) amplifier. Electronic amplifiers receive an electronic input signal and produce an electronic output signal that corresponds to the input signal multiplied by a gain factor, which is some non-zero positive or negative value.

One well-known type of I-V amplifier is a transimpedance amplifier (TIA). TIAs are often used in optical transceiver modules. In optical transceiver modules, a photodiode receives an optical signal passing out of the end of an optical fiber and produces an electrical current signal, which is then input to a TIA. The TIA then converts the electrical current signal into an electrical voltage signal, which is then output from the TIA. Other electrical circuitry downstream of the TIA processes the electrical voltage signal to recover the data bits.

Optical transceiver modules are typically required to be robust in terms of jitter performance and power consumption. In order to improve jitter performance in optical transceiver modules, it is known to include bandwidth (BW)-enhancement circuitry that increases the BW of the TIA. BW-enhancement circuitry used for this purpose adds a zero to the frequency response of the TIA to compensate for the effect of a pole that exists in the frequency response of the TIA. This BW-enhancement circuitry may take many forms, but one well known example is a resistor-capacitor (RC) shunt circuit. The disadvantage of this type of BW-enhancement circuitry is that it often results in "peaking" of the frequency response of the TIA, i.e., an overshooting of the gain of the frequency response. In high-speed optical transceiver modules that utilize adaptive equalizers, peaking should be minimized or prevented because the input signal to the equalizer must generally be linear in order for the equalizer to properly perform equalization.

An important characteristic of an electronic amplifier is the gain-BW (GBW) product, which is the product of the BW of the amplifier and the gain at which the BW is measured. The GBW product for an amplifier is generally constant over the operating range of the amplifier when amplifier biasing is not changed. Thus, an increase in the gain of the amplifier is usually accompanied by a decrease in BW, and vice versa. One way to reduce peaking is to reduce the BW of the amplifier. However, simply reducing the BW of the amplifier is undesirable in many cases and is counter to the goal of providing BW enhancement.

Accordingly, a need exists for way to provide BW enhancement in an electronic amplifier while also preventing, or at least reducing, peaking of the frequency response of the amplifier.

SUMMARY OF THE INVENTION

The invention is directed to an apparatus and a method for automatically adjusting the BW of an electronic amplifier. The apparatus comprises an electronic amplifier having a BW that is adjustable, an amplitude detector circuit having an input that is electrically coupled to an output of the electronic amplifier, and an automatic BW adjustment circuit having an input that is electrically coupled to an output of the amplitude detector circuit and having an output that is electrically coupled to circuitry of the electronic amplifier. The electronic amplifier receives a first input signal and produces a first output signal that is an amplified version of the first input signal. The amplitude detector circuit detects the amplitude of the first output signal and produces an amplitude detection signal indicative of the amplitude of the first output signal. The automatic BW adjustment circuit produces a BW adjustment signal that is based on the amplitude detection signal. The BW adjustment signal that is output by the automatic BW adjustment circuit is received by circuitry of the electronic amplifier. The electronic amplifier adjusts its BW based on the BW adjustment signal.

The method is as follows. The electronic amplifier receives a first input signal at its input and outputs a first output signal at its output corresponding to an amplified version of the first input signal. The electronic amplifier amplifies the first input signal by a non-zero gain value to produce the amplified version of the first input signal. The amplitude detector circuit detects the amplitude of the first output signal and produces an amplitude detection signal indicative of the amplitude of the first output signal. The automatic BW adjustment circuit receives the amplitude detection signal at its input and produces a BW adjustment signal that is based on the amplitude detection signal, which is then output from the automatic BW adjustment circuit and received by circuitry of the electronic amplifier. The electronic amplifier adjusts its BW based on the BW adjustment signal.

These and other features and advantages of the invention will become apparent from the following description, drawings and claims.

BRIEF DESCRIPTION OF THE DRAWINGS

FIG. 3 illustrates an example of a schematic diagram of BW-enhancement circuitry that may be incorporated into the amplifier shown in FIG. 2 and controlled to perform automatic BW adjustment.

FIG. 4 illustrates an example of a schematic diagram of BW-adjustment circuitry that may be incorporated into the amplifier shown in FIG. 2 and controlled to perform automatic BW adjustment.

DETAILED DESCRIPTION OF AN ILLUSTRATIVE EMBODIMENT

In accordance with embodiments of the invention, the BW of an electronic amplifier is automatically adjusted by an automatic BW-adjustment circuit based on the amplitude of a signal that is output from the amplifier or from one or more gain stages that follow the amplifier. In this way, BW enhancement can be provided while also preventing, or at least reducing, peaking.

The apparatus includes an electronic amplifier, an amplitude detector circuit, and an automatic BW adjustment circuit. An output of the electronic amplifier is electrically coupled to an input of the amplitude detector circuit, although one or more gain stages may be interposed between the output of the electronic amplifier and the input of the amplitude detector circuit. An output of the amplitude detector circuit is electrically coupled to an input of the automatic BW adjustment circuit. An output of the automatic BW adjustment circuit is electrically coupled to a node of the amplifier. The amplitude detector circuit receives at least a portion of the signal that is output from the amplifier or from one or more gain stages that follow the amplifier. The amplitude detector circuit then outputs a signal indicative of the amplitude of the signal. The automatic BW adjustment circuit receives the signal output from the amplitude detector circuit and produces a BW-adjustment signal at an output thereof, which is then applied to circuitry of the amplifier. The BW-adjustment signal causes the BW of the amplifier to be adjusted based on the amplitude detected by the amplitude detector circuit.

Typically, but not necessarily, when the amplitude of the signal detected by the amplitude detector circuit decreases, the BW-adjustment signal that is output from the automatic BW adjustment circuit will cause the BW of the amplifier to be reduced, and vice versa. A few illustrative, or exemplary, embodiments will now be described with reference to FIGS. 1-5.

Figure 1:
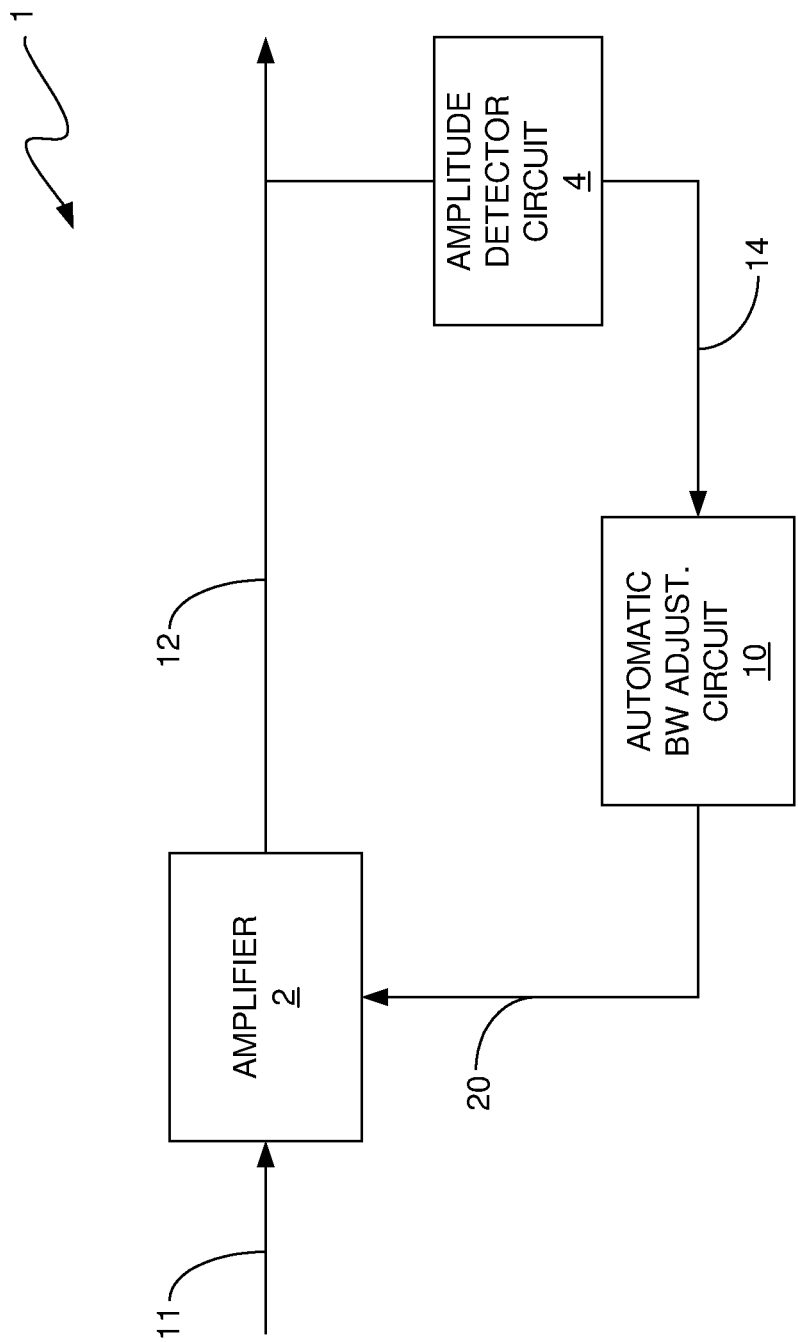
FIG. 1 illustrates a block diagram of the apparatus for performing automatic BW adjustment in an amplifier in accordance with an illustrative embodiment.

FIG. 1 illustrates a block diagram of the apparatus 1 for performing automatic BW adjustment in an amplifier in accordance with an illustrative embodiment. The apparatus 1 includes an electronic amplifier 2, an amplitude detector circuit 4, and an automatic BW adjustment circuit 10. The electronic amplifier 2 may be an I-V amplifier, a V-I amplifier, a V-V amplifier, or an I-I amplifier. The amplifier 2 receives an electrical current or voltage signal 11 at an input thereof and produces an electrical current or voltage signal 12 at an output thereof. One or more gain stages (not shown) may follow the amplifier 2 to provide further amplification of the output signal 12, as will be described below with reference to FIG. 2. A portion of the electrical signal 12 is then received at an input of the amplitude detector circuit 4, which then outputs an electrical signal 14 indicative of the amplitude of the signal 12. The automatic BW adjustment circuit 10 receives the signal 14 and processes the signal 14 to produces a BW adjustment signal 20. The BW adjustment signal 20 is then fed back to the amplifier 2. The amplifier 2 then adjusts its BW based on the BW adjustment signal 20.

The amplifier 2 typically includes BW-enhancement circuitry (not shown) for increasing the BW of the amplifier 2, as will be described below in detail with reference to FIGS. 3 and 5. In accordance with illustrative embodiments described herein, the BW-adjustment signal 20 that is output from the automatic BW adjustment circuit 10 is applied to the BW-enhancement circuitry of the amplifier 2 to cause the BW of the amplifier 2 to be adjusted by the BW-enhancement circuitry. As indicated above, BW-enhancement circuitry is well known and often includes an RC circuit that adds a zero to the frequency response of the amplifier to compensate for the effect of a pole that exists in the frequency response of the amplifier. In accordance with illustrative embodiments described herein, the BW-adjustment signal 20 causes the value of the capacitance of the RC circuit to be varied in a way that adjusts the location of the zero in the frequency response to vary the effect that the zero has on the pole. In this way, the automatic BW adjustment circuit 10 adjusts the BW of the amplifier 2 based on the amplitude of the signal 12.

Figure 2:
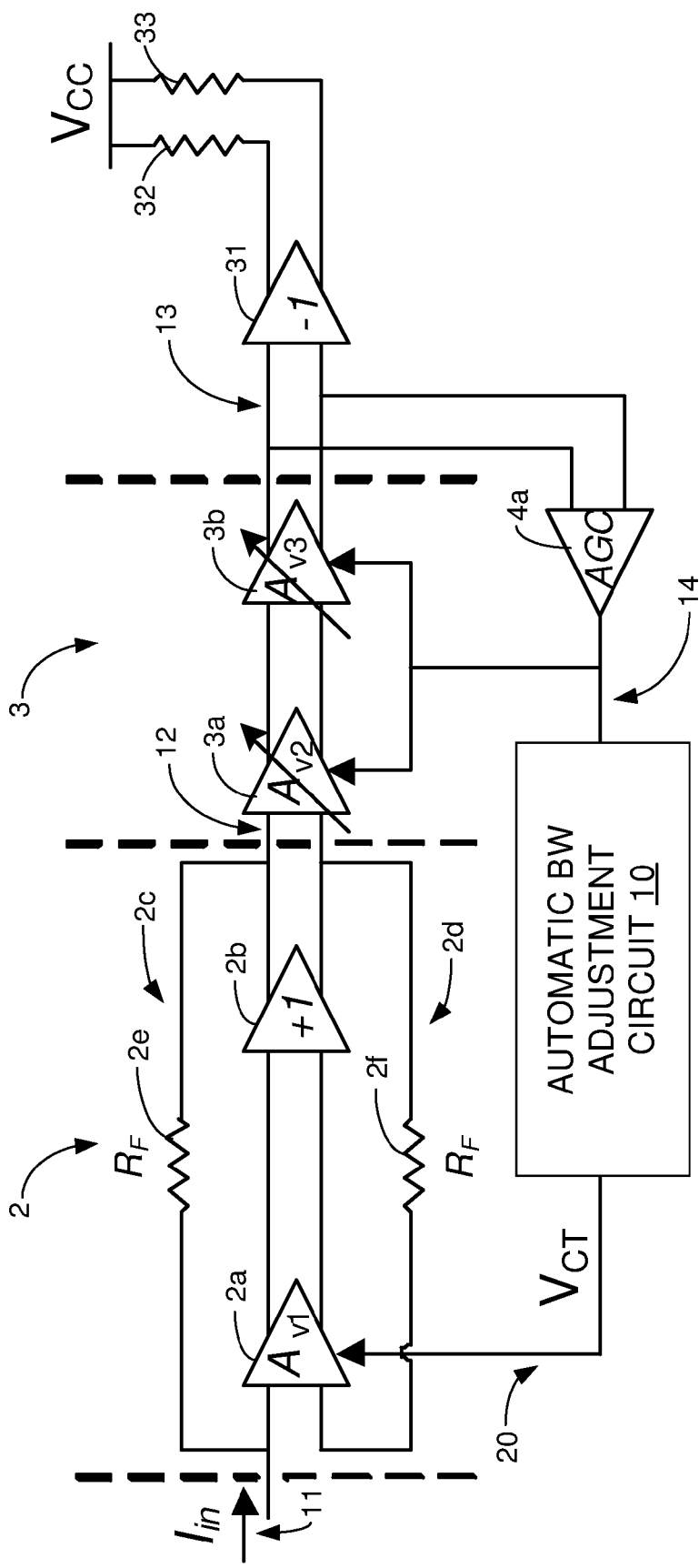
FIG. 2 illustrates a block diagram of the apparatus for performing automatic BW adjustment in an amplifier in accordance with another illustrative embodiment.

FIG. 2 illustrates a more detailed block diagram of the apparatus 1 shown in FIG. 1 in accordance with an illustrative embodiment. In accordance with this illustrative embodiment, the amplifier 2 is a TIA, which, as stated above, is an I-V amplifier. The TIA 2 has first and second amplifier stages 2a and 2b, respectively, and first and second feedback loops 2c and 2d, respectively. The first and second feedback loops 2c and 2d have first and second resistors 2e and 2f, respectively. The first resistor 2e provides the I-V conversion of the input signal 11. The second resistor 2f is a replica of the first resistor 2e and is provided to enable pseudo-random differential operation of the amplifier 2. The input electrical current signal 11 is received at an input of the first amplifier stage 2a and converted thereby into a first voltage signal, V1, which is then input to the second amplifier stage 2b. The second amplifier stage 2b is a voltage follower that produces the electrical voltage signal 12, which is then output from the TIA 2.

In accordance with this illustrative embodiment, a gain circuit 3 follows the electronic amplifier 2 and is interposed between the output of the electronic amplifier 2 and the input of the amplitude detector circuit 4. The gain circuit 3 comprises first and second variable-gain amplifier stages 3a and 3b that amplify the signal 12 to produce amplified voltage signal 13. The amplified voltage signal 13 may be processed by additional circuitry (not shown) downstream of the apparatus, such as, for example, data bit recovery circuitry.

In accordance with this illustrative embodiment, the amplitude detector circuitry 4 is part of a known AGC 4a, which varies the gain of the amplifier stages 3a and 3b in a known manner based on the detected amplitude of the signal 13 output from the gain circuitry 3. Thus, the signal that is output from the AGC 4a and used to control the gains of the amplifier stages 3a and 3b is also used by the automatic BW adjustment circuit 10 to produce the BW-adjustment signal 20. Thus, in accordance with this illustrative embodiment, the BW of the amplifier 2 is adjusted based on the output of the AGC 4a.

The automatic BW adjustment circuit 10 may be any function generator that is suitable for receiving the signal 14 output from the AGC 4a and producing the BW-adjustment signal 20. The function generator may simply be a linear function generator that multiplies the signal 14 by a scalar value or it may be a nonlinear function generator that multiplies the signal 14 by some nonlinear function (e.g., parabolic), or some combination of the two types of functions. The invention is not limited to any particular type or configuration for the function generator. Also, the automatic BW adjustment circuit 10 may include components or elements in addition to the function generator.

The amplifier 31 shown in FIG. 2 represents an inverter driver that inverts the signal 13 output from the amplifier stage 3b. The resistors 32 and 33 represent a load that is driven by the amplifier 31. The amplifier 31 and resistors 32 and 33 are optional and are shown merely for the purpose of demonstrating circuitry downstream of the TIA 2 in an optical receiver or transceiver module.

FIG. 3 illustrates a schematic diagram of an exemplary circuit configuration of BW-enhancement circuitry 40 of the type that is often used in TIAs. However, in accordance with this embodiment, the BW-enhancement circuitry 40 is configured to have the BW adjustment signal 20 applied to a node thereof in order to perform BW adjustment in the amplifier 2 in accordance with the invention. Thus, the BW-enhancement circuitry 40 is configured to perform BW adjustment in accordance with the invention.

The BW-enhancement circuitry 40 is typically part of the first amplifier stage 2a. The BW-enhancement circuitry 40 is a common emitter configuration comprising a transistor 41, an RC circuit 42 comprising a resistor 42a in parallel with two adjustable capacitors, or varactors, 42b and 42c, a load resistor 43, and a voltage supply, $V_{CC}$, 44. The input current signal 11 is applied to the base of the transistor 41. The RC circuit 42 is connected to the emitter of the transistor 41. The load resistor 43 is connected between the collector of the transistor 41 and the voltage supply 44.

The BW-enhancement circuitry 40 operates as follows. The signal $V_{CT}$ corresponds to the BW-adjustment signal 20 that is output from the automatic BW adjustment circuit 10. The signal 20 is applied to a node 45 that is in between the adjustable capacitors 42b and 42c. The value of the signal 20 causes the capacitance values of the adjustable capacitors 42b and 42c to be adjusted by particular amounts, which causes the BW of the amplifier 2 to adjust. In essence, the adjustment in the capacitance values causes the location of the zero in the frequency response of the amplifier 2 to move such that the manner in which the zero compensates for the effect of the pole in the frequency response changes.

FIG. 4 illustrates a schematic diagram of an exemplary circuit configuration of BW-adjustment circuitry 50 that may be incorporated into the first stage 2a of the amplifier 2 shown in FIG. 2 to perform BW adjustment. The BW-adjustment circuitry 50 may be employed in the amplifier 2 when the aforementioned BW-enhancement circuitry (e.g., FIG. 3) is not employed in the amplifier 2. In contrast to the circuit configuration shown in FIG. 3, which adds a zero to compensate for the effects of a pole in the frequency response of the amplifier 2, the circuit configuration shown in FIG. 4 adds a pole to the frequency response of the amplifier 2. As will be described below in more detail, the BW-adjustment signal 20 is applied to a node of the BW-adjustment circuitry 50 to cause the frequency of the pole to be varied, thereby causing the BW of the amplifier to be adjusted.

The BW-adjustment circuitry 50 comprises a transistor 51, an RC circuit 52 comprising a resistor 52a in parallel with two adjustable capacitors, or varactors, 52b and 52c, a load resistor 53, and a voltage supply, $V_{CC}$, 54. The input current signal 11 is applied to the emitter of the transistor 51. A bias voltage, $V_b$, is applied to the base of the transistor 51. The RC circuit 52 is connected to the collector of the transistor 51. The load resistor 53 is connected between the emitter of the transistor 51 and ground. The BW-adjustment circuitry 50 operates as follows. The signal $V_{CT}$, which corresponds to the BW-adjustment signal 20, is applied to a node 55 that is in between the adjustable capacitors 52b and 52c. The value of the signal 20 causes the capacitance values of the adjustable capacitors 52b and 52c to be adjusted, which causes the BW of the amplifier 2 to adjust. As indicated above, the adjustment in the capacitance values causes the location of the pole in the frequency response of the amplifier 2 to move, which changes the frequency of the pole, thereby changing the BW of the amplifier 2.

Figure 5:
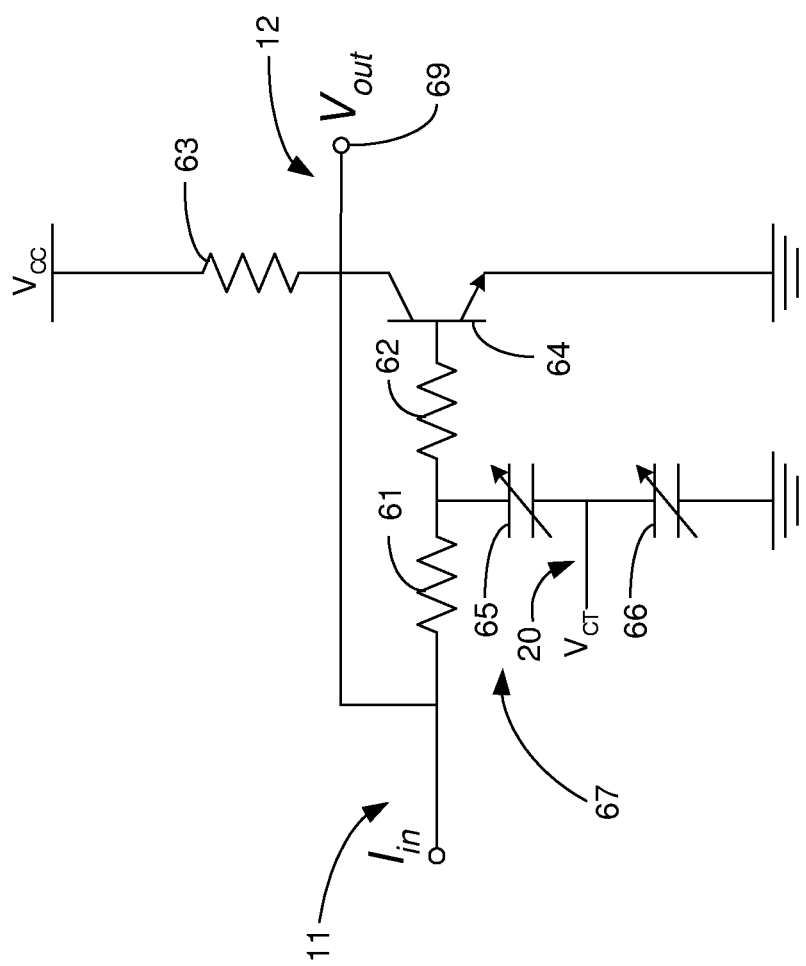
FIG. 5 illustrates an example of a schematic diagram of BW-enhancement circuitry that may be employed in the amplifier shown in FIGS. 1 and 2 and controlled to perform automatic BW adjustment.

FIG. 5 illustrates yet another exemplary circuit configuration of BW-enhancement circuitry 60 that may be employed in the amplifier 2 for adjusting the BW of the amplifier based on the BW-adjustment signal 20. The BW-enhancement circuitry 60 is typically employed in the amplifier 2, which, in accordance with this embodiment, is the single-stage amplifier shown in FIG. 5. The BW-enhancement circuitry 60 includes first, second and third resistors 61, 62 and 63, respectively, a transistor 64, and first and second adjustable capacitors, or varactors, 65 and 66, respectively. The resistors 61 and 62 and the adjustable capacitors 65 and 66 together form a T-shaped RC network 67 that provides a zero in the frequency response of the amplifier. The input signal 11, which in this case is a current signal, is electrically coupled to the base of transistor 64 through the T-shaped RC network 67. The collector of the transistor 64 is connected as a feedback loop back to the input terminal 68. The output terminal 69 outputs the voltage signal $V_{OUT}$, which corresponds to signal 12. The resistors 61 and 62 perform the current-to-voltage conversion.

The BW-enhancement circuitry 60 operates as follows. The signal $V_{CT}$ corresponds to the BW-adjustment signal 20 that is output from the automatic BW adjustment circuit 10. The signal 20 is applied to a node that is in between the adjustable capacitors 65 and 66. The value of the signal 20 causes the capacitance values of the adjustable capacitors 65 and 66 to be adjusted by particular amounts, which causes the BW of the amplifier 2 to adjust. In essence, the adjustment in the capacitance values causes the location of the zero in the frequency response of the amplifier 2 to move such that the manner in which the zero compensates for the effect of the pole in the frequency response changes.

It should be noted that the BW-enhancement or adjustment circuitry that is employed in the amplifier 2 is not limited to the configurations shown in FIGS. 3-5. The configurations shown in FIGS. 3-5 are merely examples of BW-enhancement or adjustment circuitry that may be used for this purpose, as will be understood by persons skilled in the art in view of the description provided herein. One of the advantages of using BW-enhancement circuitry of the type shown in FIG. 3 is that TIAs are often equipped with such circuitry, which obviates the need to provide additional circuitry in the amplifier for the purpose of adjusting the BW of the amplifier 2. However, as will be understood by persons skilled in the art, in view of the discussion provided herein, BW adjustment may be performed in other ways using other circuit configurations.

It should be noted that the invention has been described with respect to illustrative embodiments for the purpose of describing the principles and concepts of the invention. The invention is not limited to these embodiments, as will be understood by persons of skill in the art in view of the description provided herein. For example, the invention is not limited to the circuit configurations shown in FIGS. 2-5. As will be understood by those skilled in the art in view of the description being provided herein, many modifications may be made to the embodiments described herein while still achieving the goals of the invention, and all such modifications are within the scope of the invention.

What is claimed is:

1. An apparatus for automatically adjusting the bandwidth (BW) of an electronic amplifier, the apparatus comprising:

an electronic amplifier having an input for receiving a first input signal and an output for outputting a first output signal corresponding to an amplified version of the first input signal, the electronic amplifier amplifying the first input signal by a non-zero gain value to produce the amplified version of the first input signal, the electronic amplifier having a BW that is adjustable, the electronic amplifier including BW-enhancement circuitry capable of enhancing the BW of the electronic amplifier, the BW-enhancement circuitry includes at least one resistor and at least one variable capacitor;

an amplitude detector circuit having an input and an output, the input of the amplitude detector circuit being electrically coupled to the output of the electronic amplifier for receiving at least a portion of the first output signal, the amplitude detector circuit detecting an amplitude of the first output signal and producing an amplitude detection signal indicative of an amplitude of the first output signal; and an automatic BW adjustment circuit having an input that is electrically coupled to the output of the amplitude detector circuit for receiving the amplitude detection signal, the automatic BW adjustment circuit being configured to produce a BW adjustment signal that is based on the amplitude detection signal, the automatic BW adjustment circuit having an output for outputting the BW adjustment signal, the output of the automatic BW adjustment circuit being electrically coupled to the electronic amplifier such that the BW adjustment signal is applied to a node of the BW-enhancement circuitry to cause at least one capacitance value of said at least one variable capacitor to be varied, and wherein the variation in the capacitance value causes the BW of the electronic amplifier to be adjusted; and a gain circuit having an input that is electrically coupled to the output of the electronic amplifier for receiving the first output signal and having an output that is electrically coupled to the input of the amplitude detector circuit, the gain circuit comprising at least one adjustable gain stage that receives the first output signal and amplifies the first output signal to produce an amplified first output signal, the gain circuit amplifying the first output signal by a non-zero gain value to produce the amplified first output signal, and wherein the amplitude detection signal is indicative of an amplitude of the amplified first output signal.

2. The apparatus of claim 1, wherein the amplitude detector circuit is part of an automatic gain control (AGC) circuit, and wherein the AGC circuit adjusts a gain of said at least one gain stage of the gain circuit based on the amplitude of the amplified first output signal.

3. The apparatus of claim 2, wherein the electronic amplifier is a current-to-voltage (I-V) electronic amplifier such that the first input signal is an electrical current signal and the first output signal is an electrical voltage signal.

4. The apparatus of claim 3, wherein the electronic amplifier is a transimpedance amplifier, and wherein the apparatus is part of an optical receiver.

5. The apparatus of claim 1, wherein the electronic amplifier is a current-to-current (I-I) electronic amplifier such that the first input signal is an electrical current signal and the first output signal is an electrical current signal.

6. The apparatus of claim 1, wherein the electronic amplifier is a voltage-to-voltage (V-V) electronic amplifier such that the first input signal is an electrical voltage signal and the first output signal is an electrical voltage signal.

7. The apparatus of claim 1, wherein the electronic amplifier is a voltage-to-current (V-I) electronic amplifier such that the first input signal is an electrical voltage signal and the first output signal is an electrical current signal.

8. The apparatus of claim 1, wherein said at least one resistor is in parallel with said at least one variable capacitor.

9. An apparatus for automatically adjusting the bandwidth (BW) of an electronic amplifier, the apparatus comprising:

an electronic amplifier having an input for receiving a first input signal and an output for outputting a first output signal corresponding to an amplified version of the first input signal, the electronic amplifier amplifying the first input signal by a non-zero gain value to produce the amplified version of the first input signal, the electronic amplifier having a BW that is adjustable, the electronic amplifier including BW-enhancement circuitry capable of enhancing the BW of the electronic amplifier, the BW-enhancement circuitry including at least at least two variable capacitors connected in series with each other and in parallel with said at least one resistor;

an amplitude detector circuit having an input and an output, the input of the amplitude detector circuit being electrically coupled to the output of the electronic amplifier for receiving at least a portion of the first output signal, the amplitude detector circuit detecting an amplitude of the first output signal and producing an amplitude detection signal indicative of an amplitude of the first output signal; and an automatic BW adjustment circuit having an input that is electrically coupled to the output of the amplitude detector circuit for receiving the amplitude detection signal, the automatic BW adjustment circuit being configured to produce a BW adjustment signal that is based on the amplitude detection signal, the automatic BW adjustment circuit having an output for outputting the BW adjustment signal, the output of the automatic BW adjustment circuit being electrically coupled to the electronic amplifier such that the BW adjustment signal is applied to a node of the BW-enhancement circuitry that is in between the two capacitors to cause capacitance values of said at least two variable capacitors to be varied, and wherein the variation in the capacitance values causes the BW of the electronic amplifier to be adjusted.

10. The apparatus of claim 9, wherein the electronic amplifier is a current-to-current (I-I) electronic amplifier such that the first input signal is an electrical current signal and the first output signal is an electrical current signal.

11. The apparatus of claim 9, wherein the electronic amplifier is a voltage-to-voltage (V-V) electronic amplifier such that the first input signal is an electrical voltage signal and the first output signal is an electrical voltage signal.

12. The apparatus of claim 9, wherein the electronic amplifier is a voltage-to-current (V-I) electronic amplifier such that the first input signal is an electrical voltage signal and the first output signal is an electrical current signal.

13. The apparatus of claim 9, wherein the electronic amplifier is a current-to-voltage (I-V) electronic amplifier such that the first input signal is an electrical current signal and the first output signal is an electrical voltage signal.

14. The apparatus of claim 13, wherein the electronic amplifier is a transimpedance amplifier, and wherein the apparatus is part of an optical receiver.

15. A method for automatically adjusting the bandwidth (BW) of an electronic amplifier, the method comprising:

in an electronic amplifier, receiving a first input signal at an input of the electronic amplifier and outputting a first output signal at an output of the electronic amplifier, the first output signal corresponding to an amplified version of the first input signal, the electronic amplifier amplifying the first input signal by a non-zero gain value to produce the amplified version of the first input signal, the electronic amplifier having a BW that is adjustable, the electronic amplifier including BW-enhancement circuitry capable of enhancing the BW of the electronic amplifier, the BW-enhancement circuitry including at least one resistor and at least one variable capacitor;

in an amplitude detector circuit having an input that is electrically coupled to the output of the electronic amplifier, detecting an amplitude of the first output signal, producing an amplitude detection signal indicative of an amplitude of the first output signal, and outputting the amplitude detection signal at an output of the amplitude detector circuit;

in an automatic BW adjustment circuit having an input that is electrically coupled to an output of the amplitude detector circuit, receiving the amplitude detection signal, producing a BW adjustment signal that is based on the amplitude detection signal, and outputting the BW adjustment signal at an output of the automatic BW adjustment circuit, the output of the automatic BW adjustment circuit being electrically coupled to the electronic amplifier; and in the electronic amplifier, receiving the BW adjustment signal at a node of the BW-enhancement circuitry, wherein receipt of the BW adjustment signal at the node causes at least one capacitance value of said at least one variable capacitor to be varied, and wherein the variation in the capacitance value causes the BW of the electronic amplifier to be adjusted; and in a gain circuit having an input that is electrically coupled to the output of the electronic amplifier and having an output that is electrically coupled to the input of the amplitude detector circuit, receiving the first output signal and outputting an amplified first output signal at an output of the gain circuit, the gain circuit comprising at least one adjustable gain stage that receives the first output signal and amplifies the first output signal by a non-zero gain value to produce the amplified first output signal, and wherein the amplitude detection signal is indicative of an amplitude of the amplified first output signal.

16. The method of claim 15, wherein the amplitude detector circuit is part of an automatic gain control (AGC) circuit, and wherein the AGC circuit adjusts a gain of said at least one gain stage of the gain circuit based on the amplitude of the amplified first output signal.

17. The method of claim 16, wherein the electronic amplifier is a current-to-voltage (I-V) electronic amplifier such that the first input signal is an electrical current signal and the first output signal is an electrical voltage signal.

18. The method of claim 17, wherein the electronic amplifier is a transimpedance amplifier, and wherein the apparatus is part of an optical receiver.

19. The method of claim 15, wherein the electronic amplifier is a current-to-current (I-I) electronic amplifier such that the first input signal is an electrical current signal and the first output signal is an electrical current signal.

20. The method of claim 15, wherein the electronic amplifier is a voltage-to-voltage (V-V) electronic amplifier such that the first input signal is an electrical voltage signal and the first output signal is an electrical voltage signal.

21. The method of claim 15, wherein the electronic amplifier is a voltage-to-current (V-I) electronic amplifier such that the first input signal is an electrical voltage signal and the first output signal is an electrical current signal.

22. The method of claim 15, wherein said at least one resistor is in parallel with said at least one variable capacitor.

23. A method for automatically adjusting the bandwidth (BW) of an electronic amplifier, the method comprising:

in an electronic amplifier, receiving a first input signal at an input of the electronic amplifier and outputting a first output signal at an output of the electronic amplifier, the first output signal corresponding to an amplified version of the first input signal, the electronic amplifier amplifying the first input signal by a non-zero gain value to produce the amplified version of the first input signal, the electronic amplifier having a BW that is adjustable, the electronic amplifier including BW-enhancement circuitry capable of enhancing the BW of the electronic amplifier, the BW-enhancement circuitry including at least two variable capacitors connected in series with each other and in parallel with said at least one resistor;

in an amplitude detector circuit having an input that is electrically coupled to the output of the electronic amplifier, detecting an amplitude of the first output signal, producing an amplitude detection signal indicative of an amplitude of the first output signal, and outputting the amplitude detection signal at an output of the amplitude detector circuit;

in an automatic BW adjustment circuit having an input that is electrically coupled to an output of the amplitude detector circuit, receiving the amplitude detection signal, producing a BW adjustment signal that is based on the amplitude detection signal, and outputting the BW adjustment signal at an output of the automatic BW adjustment circuit, the output of the automatic BW adjustment circuit being electrically coupled to the electronic amplifier; and in the electronic amplifier, receiving the BW adjustment signal at a node of the BW-enhancement circuitry that is in between the two capacitors, wherein receipt of the BW adjustment signal at the node causes capacitance values of the two variable capacitors to be varied, and wherein the variation in the capacitance values causes the BW of the electronic amplifier to be adjusted.

24. The method of claim 23, wherein the amplitude detector circuit is part of an automatic gain control (AGC) circuit, and wherein the AGC circuit adjusts a gain of said at least one gain stage of the gain circuit based on the amplitude of the amplified first output signal.

25. The method of claim 23, wherein the electronic amplifier is a current-to-current (I-I) electronic amplifier such that the first input signal is an electrical current signal and the first output signal is an electrical current signal.

26. The method of claim 23, wherein the electronic amplifier is a voltage-to-voltage (V-V) electronic amplifier such that the first input signal is an electrical voltage signal and the first output signal is an electrical voltage signal.

27. The method of claim 23, wherein the electronic amplifier is a voltage-to-current (V-I) electronic amplifier such that the first input signal is an electrical voltage signal and the first output signal is an electrical current signal.

28. The method of claim 23, wherein the electronic amplifier is a current-to-voltage (I-V) electronic amplifier such that the first input signal is an electrical current signal and the first output signal is an electrical voltage signal.

29. The method of claim 28, wherein the electronic amplifier is a transimpedance amplifier, and wherein the apparatus is part of an optical receiver.

* * * * *